(12) United States Patent
Lellis Junior et al.

(10) Patent No.: US 11,495,957 B2
(45) Date of Patent: Nov. 8, 2022

(54) SINGLE-PHASE EQUIPOTENTIAL SELF-POWERED LOW-COST EASY-TO-INSTALL RECLOSER

(71) Applicant: ENERGISA S/A, Minas Gerais (BR)

(72) Inventors: Celso Garcia Lellis Junior, Santana de Parnaiba (BR); Ayres Antonio Paes De Oliveira, Santana de Parnaiba (BR)

(73) Assignee: ENERGISA S/A, Minas Gerais (BR)

( * ) Notice: Subject to any disclaimer, the term of this patent is extended or adjusted under 35 U.S.C. 154(b) by 317 days.

(21) Appl. No.: 16/756,421

(22) PCT Filed: Jun. 7, 2019

(86) PCT No.: PCT/BR2019/050215
§ 371 (c)(1),
(2) Date: Apr. 15, 2020

(87) PCT Pub. No.: WO2020/037385
PCT Pub. Date: Feb. 27, 2020

(65) Prior Publication Data
US 2020/0244059 A1    Jul. 30, 2020

(30) Foreign Application Priority Data

Aug. 20, 2018   (BR) .................. 10 2018 016974 2

(51) Int. Cl.
| H02H 3/00 | (2006.01) |
| H02H 3/05 | (2006.01) |
| G01R 15/18 | (2006.01) |
| H01H 33/666 | (2006.01) |
| H01H 47/22 | (2006.01) |
| H01H 50/64 | (2006.01) |

(52) U.S. Cl.
CPC ............ *H02H 3/05* (2013.01); *G01R 15/181* (2013.01); *H01H 33/666* (2013.01); *H01H 47/226* (2013.01); *H01H 50/641* (2013.01)

(58) Field of Classification Search
CPC .......... H02H 3/05; H02H 3/06; G01R 15/181; H01H 33/666; H01H 47/226
See application file for complete search history.

(56) References Cited

U.S. PATENT DOCUMENTS

| 5,912,604 | A | 6/1999 | Harvey et al. |
| 6,687,573 | B2 | 2/2004 | Egolf et al. |
| 6,707,655 | B2 | 3/2004 | McElray, Sr. et al. |
| 2014/0277804 | A1 | 9/2014 | Witte |
| 2019/0013662 | A1* | 1/2019 | Norrga ................... H02H 3/021 |
| 2020/0321772 | A1* | 10/2020 | Groeger ................ H01F 27/402 |

* cited by examiner

*Primary Examiner* — Adolf D Berhane
*Assistant Examiner* — Afework S Demisse
(74) *Attorney, Agent, or Firm* — Muncy, Geissler, Olds & Lowe, P.C.

(57) ABSTRACT

The invention relates to a single-phase, equipotential, self-powered recloser with a load life of more than 20 years, for installing in 15 KV medium-voltage networks, directly on Matthews-type fuse bases, using hooksticks, and without requiring the interruption of the energy supply. Said recloser uses a bistable electromagnetic actuator that controls a vacuum bulb for interrupting the current in the event of a fault. It stores energy in ultracapacitor banks which receive the first charge by means of an induction coil.

18 Claims, 12 Drawing Sheets

SINGLE-PHASE EQUIPOTENTIAL SELF-POWERED LOW-COST EASY-TO-INSTALL RECLOSER

FIELD OF DISCLOSURE

This invention relates to a single-phase recloser, in particular to a single-phase, equipotential, self-powered recloser for installation in 15 KV medium voltage networks, directly in Matheus fuse bases, with the use of maneuvering rods, without the need to interrupt the power supply.

BACKGROUND

The power of a single-phase recloser is provided by the current that circulates through the network, through the use of a current transformer and/or photovoltaic cells, its not being necessary to use a medium transformer for low voltage. The energy drawn from these elements is stored in two ultracapacitor banks, one for the electronics and one for powering the bistable electromagnetic actuator, thus eliminating the need for preventive and corrective maintenance regarding the use of batteries. It uses a vacuum ampoule to perform the disconnection and reconnection function. The vacuum ampoule is driven by a light low-cost bistable electromagnetic actuator as described in patent BR10 2016 004841-9, "BISTABLE, CLOSED FIELD, SIMPLE, LIGHT, LOW-COST ELECTROMAGNETIC ACTUATOR", from the same inventor as this patent. For its operation during periods of maintenance, it uses, on one of its sides, bistable maneuvering rods. The bistable movements of these rods were achieved with the use of magnetic forces supplied by rare earth magnets. One of the rods transfers its external movement to an internal movement, which, for safety reasons, mechanically locks the bistable electromagnetic actuator. This transfer of motion also uses magnetic forces from rare earth magnets. For visual signaling of the status, a tricolor LED system was used with a mechanical flag, directly connected to the axis of the bistable electromagnetic actuator, using a magnetic connecting rod. The first charge of the ultracapacitors is performed by an induction charger, thus avoiding the use of mechanical connectors. The use of magnetic forces in the maneuvering rods and in the connection of the status flag, and the first induction charging of the ultracapacitors, allow for an airtight encapsulation to be easily achieved (IP67). In case of a "permanent fault", the recloser has its electronics powered by a specific bank of ultracapacitors and the energy expended is replaced by a set of photovoltaic minicells, capable of recharging the ultracapacitors, even on cloudy days. In addition to replenishing the energy of the electronics ultracapacitors, expended during the "permanent fault", the photovoltaic minicells also replenish the energy of the ultracapacitor bank of the bistable electromagnetic actuator, expended by the leakage current of these ultracapacitors. This power system allows the recloser to remain in a state of "permanent fault" the entire time. After the problem of the "permanent fault" is resolved, all that is required is a radio command or operation via maneuvering rods, for the recloser to act, closing the contacts of the vacuum ampoule and reestablishing normal operations.

The single-phase reclosers of the state of the art are expensive, heavy, and difficult to install and maintain. They were based on traditional three-phase reclosers, and on the same technical solutions present in this equipment.

There are several limitations for the use of single-phase reclosers in rural networks. However, all the points emphasized here apply identically to urban single-phase networks. We can divide the state of the art of single-phase reclosers into two main strands. Those that are only a single-phase reproduction of three-phase solutions of their manufacturers, and a second group, of more recent application, represented by equipment that has an installation configuration similar to the product of this patent, but with very limited functions arising from technical issues that will be described here.

In general, the monopolar reclosers of the first group require auxiliary physical infrastructure for their installation in the electrical circuits. This infrastructure is usually composed of a metal support, by-pass switches inserted upstream and downstream of the equipment, and a third short circuit switch, to enable the maintenance of the equipment without disconnection from the electricity grid. In addition, this group of equipment is powered by low voltage, requiring step-down transformers and an earth at each installation point. Because they are earthed, the reclosers of this first group need line protectors, the so-called "surge arresters" that play an important role in the protection of electronic circuits, when atmospheric discharges occur in the electrical conductors of energy networks. However, they have a certain capacity to absorb electrical surges which, when exceeded, end up affecting the very circuits they should protect.

The power supply system of this first group of equipment follows the traditional line, where low voltage power sources are associated with a set of batteries for power support, when there is a power fault in the primary medium voltage circuit. In most cases, the reclosers of this group are composed of a medium voltage interruption pole and an external control box containing electronics and a power system.

The drawbacks of this product configuration are the same as those found in the tripolar reclosers. Because they need large-scale infrastructure for their installation, in addition to the high costs for each point where is desired to insert the electricity network, there is a need for prior positioning studies for the installation to take place at the best points from the point of view of the circulating power flows. However, the electrical network is changeable, having constant insertions and withdrawals of charges, as well as expansions of its electrical circuits, which greatly modifies its electrical characteristics, disqualifying in many cases the previously stated points.

Another drawback present in this group of products of the state of the art is the need for batteries to maintain power during the interruption of the primary network current. Batteries are elements that require constant maintenance and can present problems that are difficult to predict. The absence of power supplied by the batteries can make it impossible to start a recloser exactly when the equipment is needed, preventing its remote control and requiring the physical presence of an electrician for its opening.

The increased dimensions, and the need to install two devices for a single function (control+power switch) also represents a drawback to the adoption of this type of solution for the automation of single-phase networks which are, in general, of secondary importance to the system. All these aspects are further reinforced by the susceptibility to high voltage surges, resulting from electrical discharges in medium voltage networks, which end up permanently damaging the equipment, causing heavy damage to the energy distributors.

In a second group of products, we have what are conventionally called fuse protectors. These products have a physical layout similar to the product described in this patent, allowing, in some cases, for their installation in a "Matheus" type fuse base support. However, these products have numerous limitations deriving from their constructive principle and a lack of electromechanical and electronic systems that support their operation, when the currents of the medium voltage primary circuits are absent.

The installation of the equipment of the second group can be undertaken, both in a fuse base, and serially with the primary network. For the first assembly, the products of the state of the art require the use of a special, non-market standard fuse base. Thus, with each desired installation, the teams must replace the existing fuse base with a specific one, which prevents greater mobility of installation of the product, in addition to requiring greater effort in the installation of the equipment, with consequent additional costs.

Another limiting factor of this second group is its lack of efficient energy management and storage systems. Thus, such products usually perform only a predefined sequence of reclosures and, when they need to go to lockout, which is to say, to open the primary circuit permanently, they end up physically disconnecting from the electrical network, literally "falling" off the fuse base, in a similar manner to a conventional fuse. This implies that, when there is a "permanent fault", there will always be a need to send an electrician to the installation site of the equipment, for its reconnection to the electrical network, through the use of a conventional maneuvering rod, preventing any remote-control operation of the equipment. When we consider rural circuits of tens of kilometers, this is an impediment to using this solution on a large scale. These same products of the state of the art, due to the limitations of their power systems, do not allow for remote communication with radio systems, because they do not possess stored energy for their operations.

In this same group of products there are market versions that are installed serially with conventional fuses and which, in situations analogous to those described above, remain in lockout, keeping the short circuit active, until the burning of the downstream fuse. These products operate as a "fuse saver", preventing their burning in transient events but triggering their burning in the case of permanent faults, resulting in the same consequences as the products previously described.

This second group of products did not address technical issues concerning the storage and efficient use of energy, which caused the solutions created to have numerous limitations on their use and which cannot be described as reclosers in the traditional sense of their functionalities which are: protecting electrical circuits; reestablishing their operation during transient faults, automatically and autonomously, and enabling their remote recomposition when "permanent faults" occur. Concerning this latter requirement, which is essential for use in new smart grids, the use of such products is totally inappropriate.

SUMMARY

The product described in this patent has all the characteristics necessary to define it functionally as a complete recloser: allowing for its remote control, at the time of transient faults; not having batteries that require periodic maintenance; having most of its mechanical parts injected in polymer at high pressure, making it very light and easy to install; allowing for its use in any market fuse base; and enabling its operation even in the absence of power supplied by the primary network, indefinitely. These are the main factors that characterize the originality of the present solution and this patent.

The recloser described in this patent hereby solves the problems encountered in the state of the art: it is easy to install, directly in "Matheus" type fuse bases, through the use of a maneuvering rod and without the need to interrupt the network; its circuits are powered by a current transformer with a nanocrystalline core, and/or by a set of photovoltaic cells, distributed in order to take advantage of solar energy, from sunrise to sunset; to store energy, it uses ultracapacitor banks, charged only with 75% of their nominal voltage, enabling the useful life of these ultracapacitors to be greater than 20 years, avoiding the high cost of maintenance associated with the use of batteries; it uses magnetic forces generated by rare earth magnets for the transfer of movements of the maneuvering rods from the outside to the inside, enabling an airtight sealing, (IP67); to significantly increase the average time between faults (MTBF) of the electronics, no electrolytic capacitors were used, but only ultracapacitors and ceramic capacitators; its lockout only occurs through the opening of the vacuum ampoule, it does not burn any fuse serially or turn off from the base; due to the use of low consumption electronic components and photovoltaic cells, it can remain in permanent lockout, its not being necessary to remove it from the base; the use of a lightweight, high-yield nanocrystalline core current transformer, combined with low energy consumption, allows for its operation at very low currents, below 1 Ampere; it uses a light, small, low consumption bistable electromagnetic actuator, as described in patent BR 10 2016 004841-9; it uses, for the first charge of the ultracapacitor banks, energy transfer by induction, avoiding the use of connectors.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

To facilitate the understanding of this patent, an example of a form of application will be presented accompanied by detailed figures with their descriptions.

Figure 1:
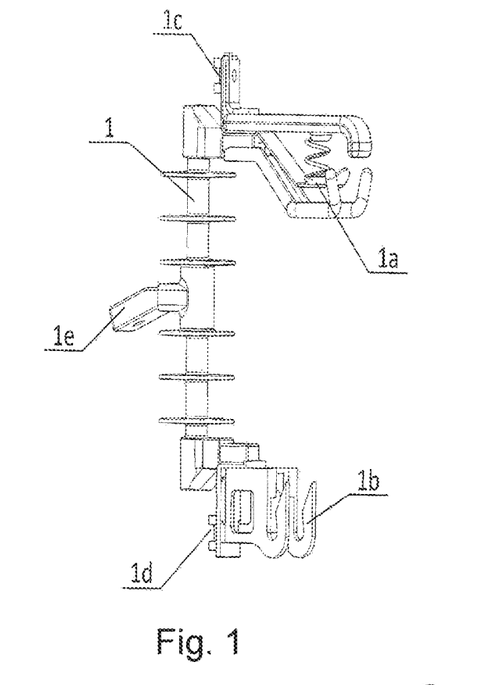
FIG. 1 shows a perspective view of a "Matheus" type fuse base according to an embodiment of the present invention.

FIG. 1 shows a "Matheus" type fuse base (1). In this figure we can see: the connection points (1a) (1b), where the recloser will be fitted; the points of connection with the electrical network (1c) (1d) and finally the mechanical support (1e).

Figure 2:
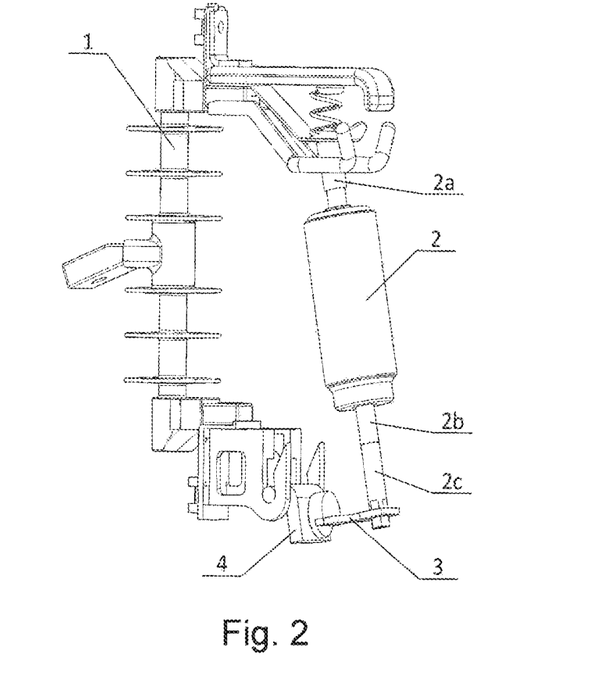
FIG. 2 shows a perspective view of the same Matheus fuse base (1) from FIG. 1, along with a vacuum ampoule (2) connected to a flexible cord 3( ) which in tern is connected to a output terminal (4), according to an embodiment of the present invention.

FIG. 2 shows the same Matheus fuse base (1), from FIG. 1, where the basic components of a recloser are present: the vacuum ampoule (2), with its fixed (2a), and mobile (2b) terminals; a conductive bar (2c) was connected to the mobile terminal (2b), which will receive, in its surroundings, the current, power and measurement transformers; the conductive bar (2c) is connected to a flexible cord (3), which in turn is connected to the output terminal (4). The current to be monitored circulates between the terminals (2a) (4), passing through the contacts of the vacuum ampoule (2), mobile terminal (2b), conductive bar (2c) and flexible cord (3).

FIGS. 3 to 14 show the assembly of a recloser, with the principles of this patent. For ease of understanding, the Matheus fuse base (1) was deleted from these figures.

Figure 3:
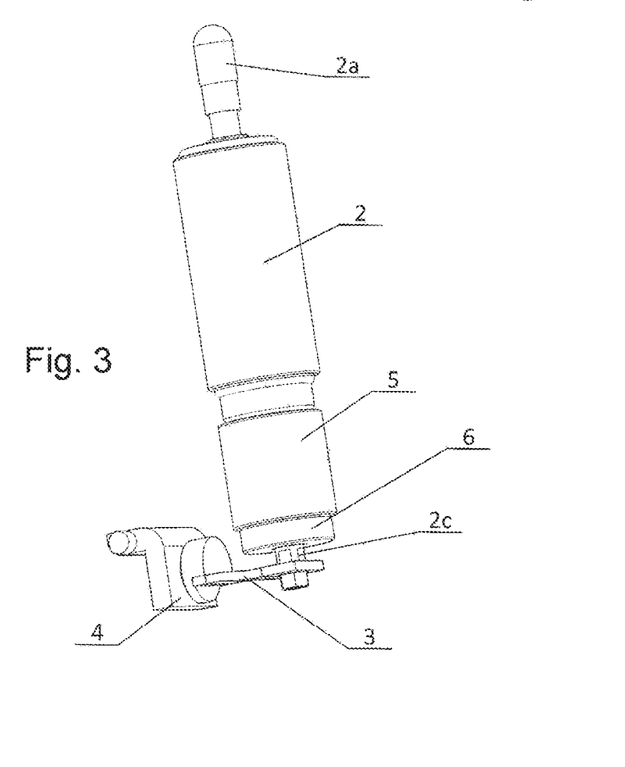
FIGS. 3 to 14 show perspective view of the assembly of a recloser according to an embodiment of the present invention.

FIG. 3 shows the vacuum ampoule (2), with its fixed side connected to the output terminal (2a), and the movable side connected to the conductive bar (2c). The conductive bar (2c) is connected to the flexible cord (3) which, in turn, is connected to the output terminal (4). The conductive bar (2c) passes through the current, power (5), and measuring transformers (6).

Figure 4:
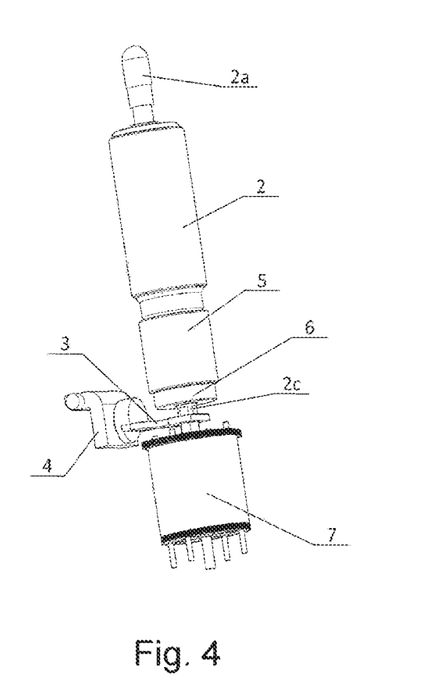

FIG. 4 shows the inclusion of a bistable electromagnetic actuator (7), as described in patent BR 10 2016 004841-9, "BISTABLE CLOSED FIELD, SIMPLE, LIGHT, LOW-COST ELECTROMAGNETIC ACTUATOR", in the assembly shown in FIG. 3. The bistable electromagnetic actuator (7) presses, through an internal spring, the contacts of the ampoule (2), with a constant force, when it is in the "closed circuit" position. The instant the central processor detects a fault (short circuit), through the measuring current transformer (6), and in accordance with the protection curves predefined in it, it sends a command to the control drivers of the bistable electromagnetic actuator and causes the actuator to move and open the contacts of the ampoule (2) interrupting the circuit. After a pre-programmed time, the CPU sends a command to the bistable electromagnetic actuator (7) to again close the contacts of the vacuum ampoule (2), thus closing the circuit. The current is measured again and if the fault persists the vacuum ampoule (2) will again be opened. These cycles will be repeated a number of pre-programmed times and if the fault persists, the vacuum ampoule (2) will remain open until an external command, via radio and/or maneuvering rods, is received by the CPU.

Figure 5:
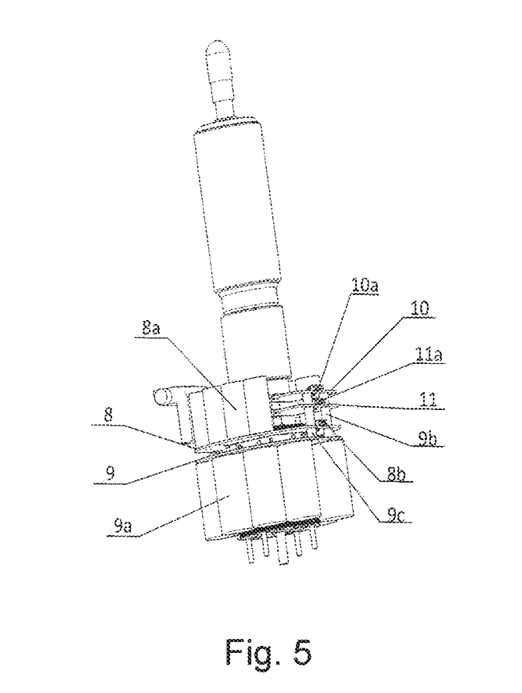

FIG. 5 shows the inclusion of the ultracapacitor assemblies and the drivers of the bistable electromagnetic actuator coils, in the assembly shown in FIG. 4: the printed circuit board (8), drilled with the diameter of the bistable electromagnetic actuator (7), and fixed to it, houses 8 ultracapacitors (8a), of 100F×2.7V each, connected in a combination of 4 parallels serially with 4 more parallels, charged with 4V, which represents 75% of the nominal voltage, extending the useful life of these ultracapacitors by more than 20 years; the printed circuit board (9), drilled with the diameter of the bistable electromagnetic actuator, fixed to the board (8), by means of spacers, (not shown), houses 8 ultracapacitors (9a), of 310F×2.7V each, connected serially and charged with 16V, which represents 75% of the nominal voltage, extending the service life of these ultracapacitors by more than 20 years; the copper bars (9b) (9c) form the connection of the 16V of the board (9), to the two driver boards of the bistable electromagnetic actuator coils (10) (11); the connectors (8b) (10a) (11a), are, respectively, of the printed circuit boards (8) (10) (11).

Figure 6:
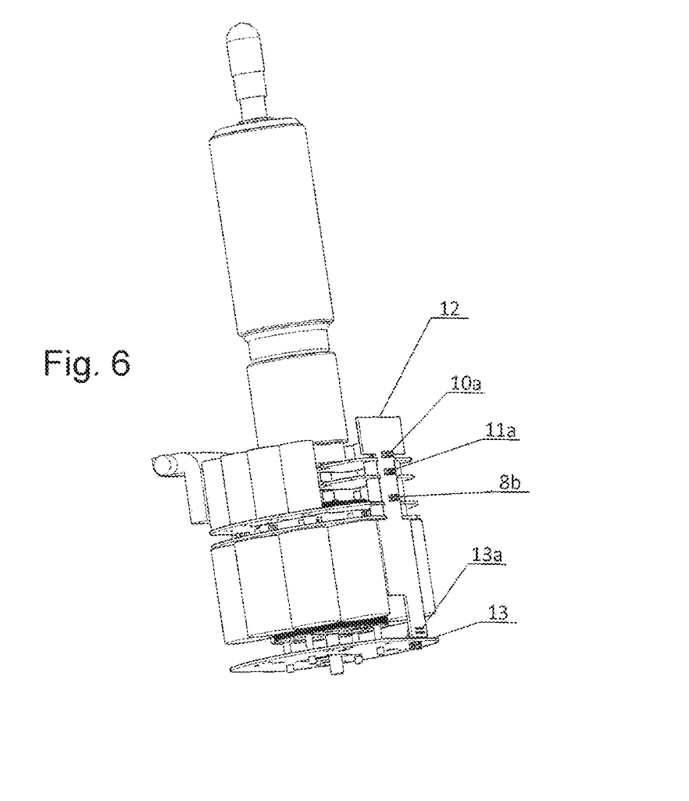

FIG. 6 shows the printed circuit boards (12) (13). The printed circuit board (12): connects all the printed circuit boards through the connectors (10a) (11a) (8b) (13a); it connects the current, power (5) and measurement transformers (6); it contains the positioning sensors of the maneuvering rods, (Hall effect); it contains the CPU and also the radio. The printed circuit board (13): contains all the power sources; it contains the positioning sensors of the bistable electromagnetic actuator (7), (Hall effect); it contains the "LED" tricolor signaling system; and it contains the coil of the induction source and the photovoltaic cells.

Figure 7:
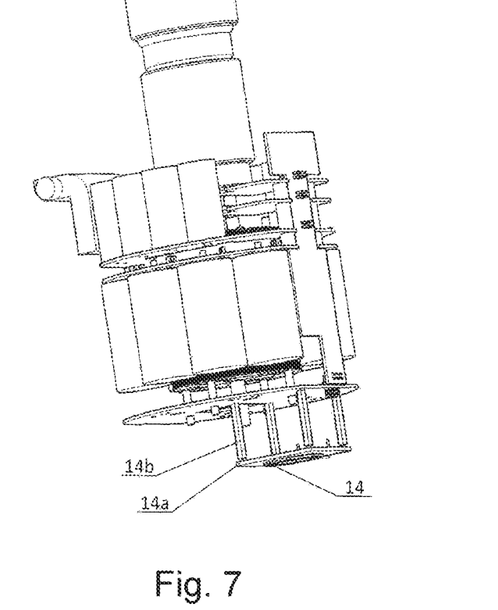

FIG. 7 shows the induction coil (14), with its ferrite core (14a) and its 4 fixing rods (14b).

Figure 8:
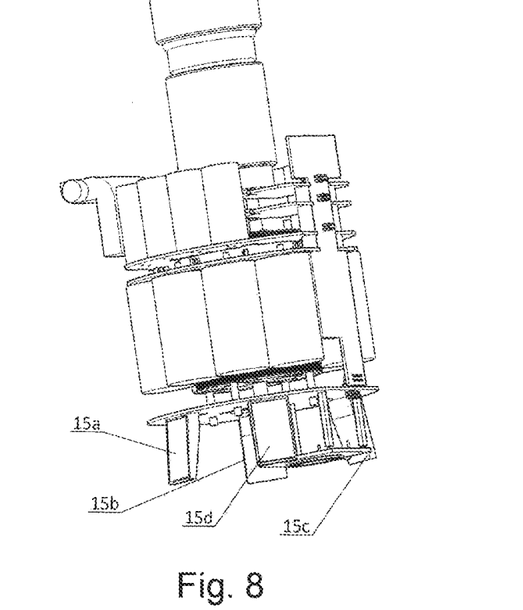

FIG. 8 shows the 4 photovoltaic cells (15a) (15b) (15c) (15d), strategically distributed to take advantage of the sun from dawn until dusk.

Figure 9:
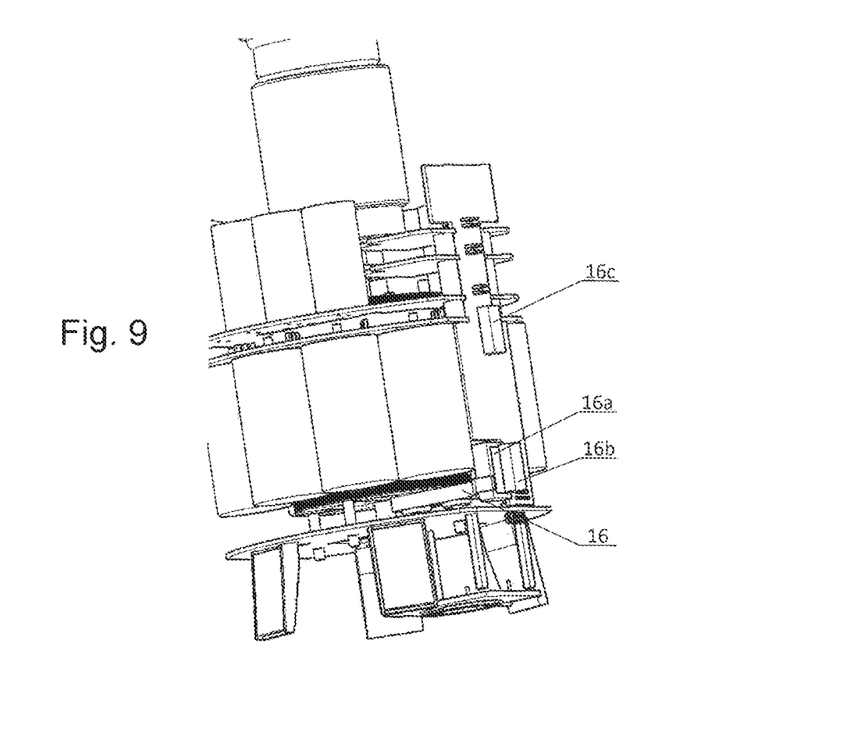

FIG. 9 shows the mechanical locking system (16) of the bistable electromagnetic actuator. The three magnets (16a) (16b) (16c) are responsible for transferring the linear movement of one of the external rods to the internal mechanical lock (16). This system will be explained below.

Figure 10:
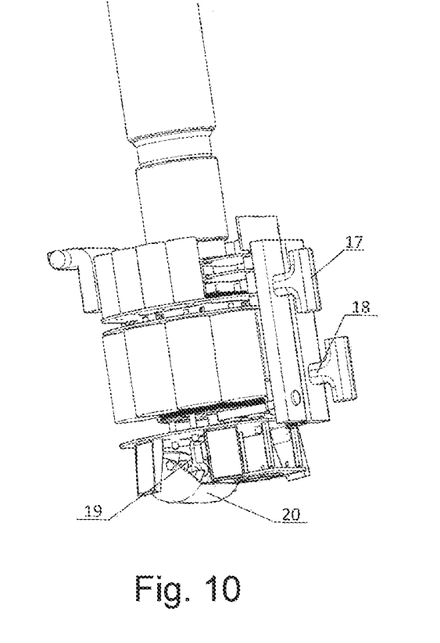

FIG. 10 shows the inclusion of the maneuvering rods, left (17), and right (18). These rods each have two small magnets (not drawn), with inverted poles that stop on top of Hall effect sensors, positioned on the printed circuit board (12). The position of the magnets allows the CPU to detect the position of each of the maneuvering rods (17) (18). The maneuvering rod on the left (17) also embeds the motion transfer magnets (16b) (16c). This figure, 10, also shows the inclusion of a connecting rod (19), attached to the axis of the bistable electromagnetic actuator (7), which transfers the linear movement from this bistable electromagnetic actuator (7) to the circular motion flag (20). The coupling between the circular motion flag (20) and the connecting rod (19) is magnetic and will be detailed below.

Figure 11:
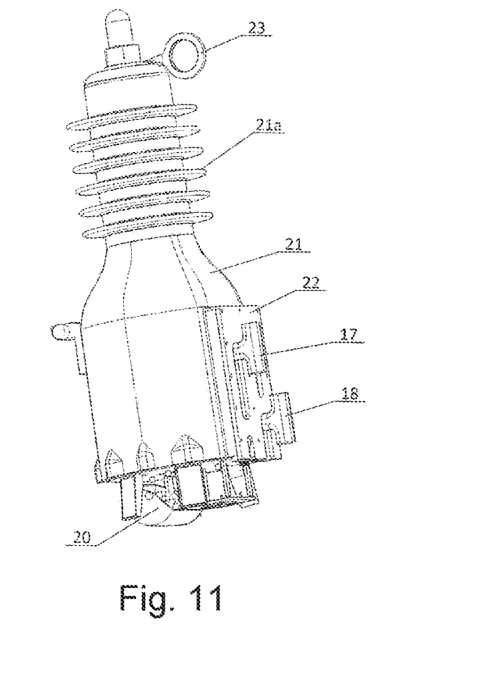

FIG. 11 shows the entire recloser mounted on a polymeric bottle (21), injected at high pressure, with its insulators (21a). The flag (20), although shown in the figure, is not mounted with the rest of the assembly. It is mounted on the transparent bottom cover and is mechanically connected with the axis (7a) of the bistable electromagnetic actuator (7) through the magnetic connecting rod (19). We can also see in this figure the ring (23), for the work with the maneuvering rod, as well as the stainless-steel plate (22), fixed on the side of the bottle (21), which fixes and limits the movements of the maneuvering rods (17) (18).

Figure 12:
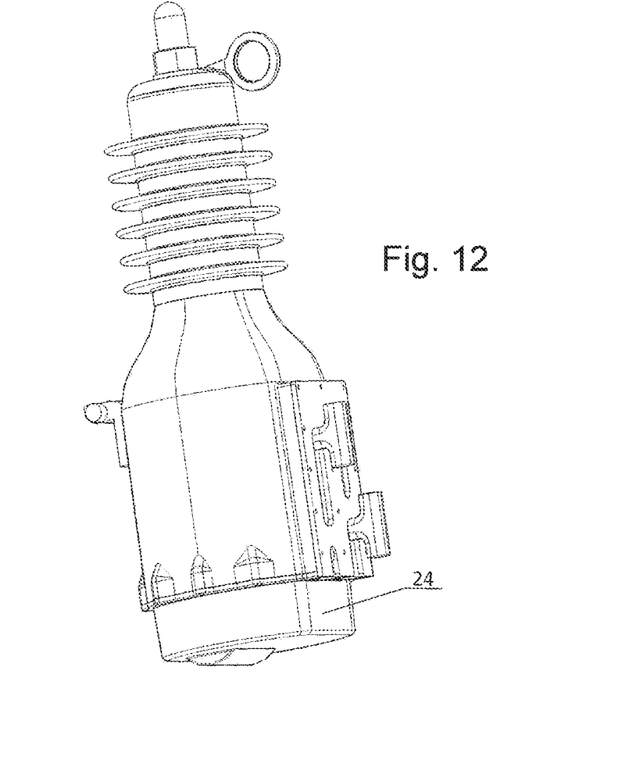

FIG. 12 shows the closing of the recloser with a transparent bottom cover (24). This cover allows for the passage of sunlight to the photovoltaic cells (15a) (15b) (15c) (15d), as well as the display of the position of the signal flag (20), and the "led" tricolor signaling system.

Figure 13:
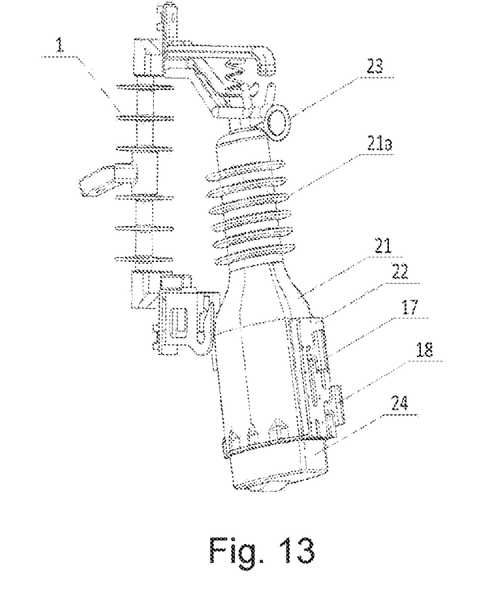

FIG. 13 shows the complete recloser mounted on the Matheus fuse base.

Figure 14:
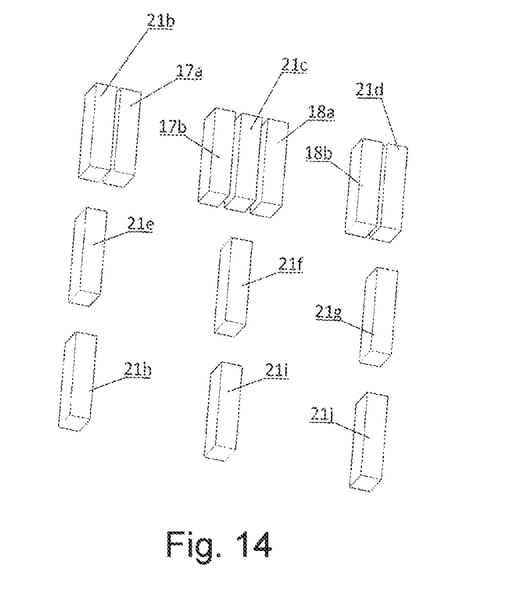

FIG. 14 shows the magnetic principle used to make the maneuvering rods (17) (18) bistable, without the need for springs and complex mechanics. The magnets (17a) (17b) are embedded in the maneuvering rod (17), and the magnets (18a) (18b), are embedded in the maneuvering rod (18). The polarities of the magnets (21b) (21c) (21d) (21h) (21i) (21j) embedded in the bottle (21), are equal to those of the magnets (17a) (17b) (18a) (18b) embedded in the maneuvering rods (17) (18). These polarities cause the maneuvering rods (17) (18) to be attracted, either to the end of the course at the top part or to the end of course at the bottom part. To prevent the maneuvering rods (17) (18), from stopping in the middle of the course, the magnets (21e) (21f) (21g), which have their polarities inverted in relation to the rod magnets, were inserted into the bottle (21e) (21f) (21g), whose polarities are inverted in relation to the magnets of the maneuvering rods (17) (18), which is to say, when the maneuvering rods (17) (18), pass through the center of the course, they are repelled upwards of downwards.

Figure 15:
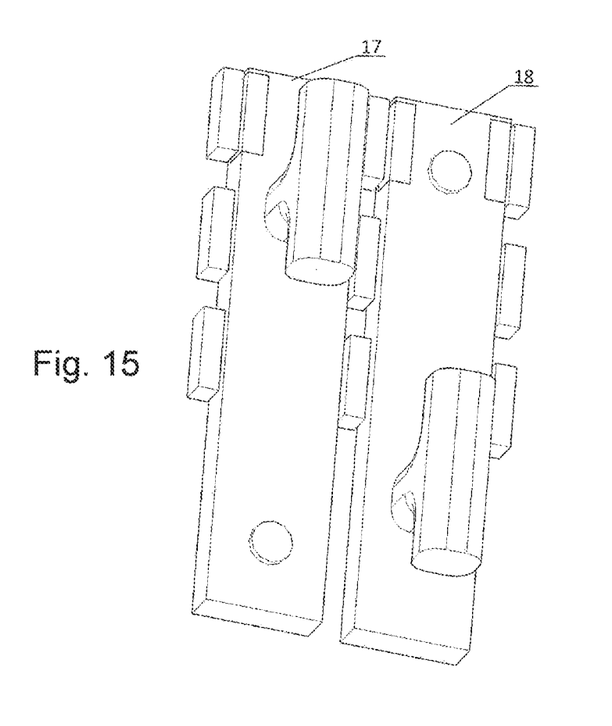
FIG. 15 shows a perspective view of the position of the maneuvering rods (17) (18), in relation to the set of magnets, according to an embodiment of the present invention.

FIG. 15 shows the position of the maneuvering rods (17) (18), in relation to the set of magnets.

Figure 16:
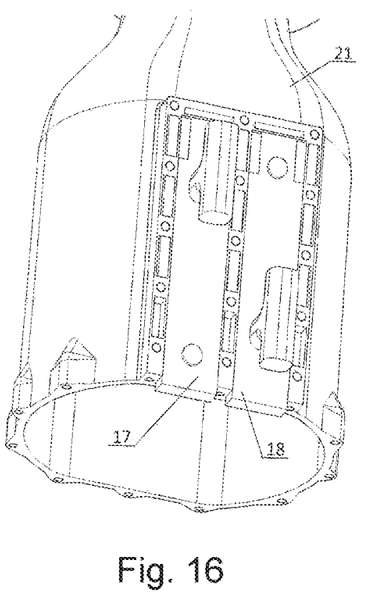
FIG. 16 shows a perspective view of the whole set of magnets and the maneuvering rods (17) (18), installed in the bottle (21), according to an embodiment of the present invention.

FIG. 16 shows the whole set of magnets magnets and the maneuvering rods (17) (18), installed in the bottle (21).

Figure 17:
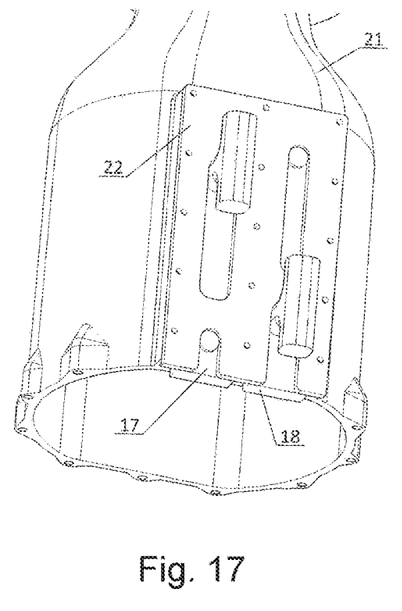
FIG. 17 shows a perspective view of the stainless-steel plate (22) which fixed to the bottle (21) according to an embodiment of the present invention.

FIG. 17 shows the stainless-steel plate (22) which fixed to the bottle (21), causes the closing of the whole set of bistable maneuvering rods (17) (18). We can observe that the stainless-steel plate (22), in addition to closing the set of bistable rods (17) (18), also limits the course of these rods.

Figure 18:
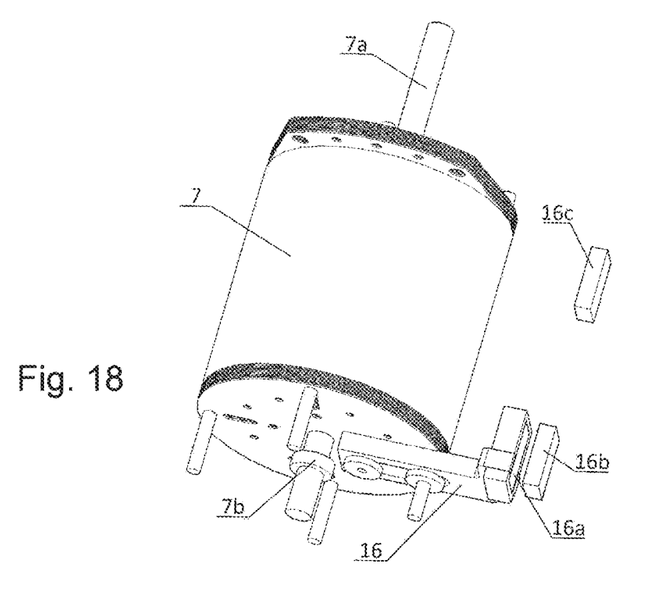
FIG. 18 shows a perspective view of the principle of magnetic motion transfer that prevents mechanical parts, in movement, from passing through the wall of the bottle (21), according to an embodiment of the present invention.

FIG. 18 shows the principle of magnetic motion transfer that prevents mechanical parts, in movement, from passing through the wall of the bottle (21). The magnets (16b) (16c) embedded in the maneuvering rod (17) possess inverted polarities. When the rod is turned up, the magnet (16b) attracts the magnet (16a) embedded in the mechanical lock (16), causing this lock to stay away from the shaft (7a) of the bistable electromagnetic actuator (7), allowing for the free movement of this axle (7a) with its ring (7b). When the maneuvering rod (17) is pulled down, the magnet (16c) is aligned with the magnet (16a), pushing the mechanical lock (16) inwards. This lock fits between the wall of the bistable electromagnetic actuator (7), and the ring (7b) of the axis (7a), preventing the activation of the bistable electromagnetic actuator. Even if the bistable electromagnetic actuator is closed, the mechanical lock will be pressed against the ring (7b), causing, on the opening of the bistable electromagnetic actuator (7), the mechanical lock (16) to immediately press against the ring (7b), preventing the closure of the bistable electromagnetic actuator (7).

Figure 19:
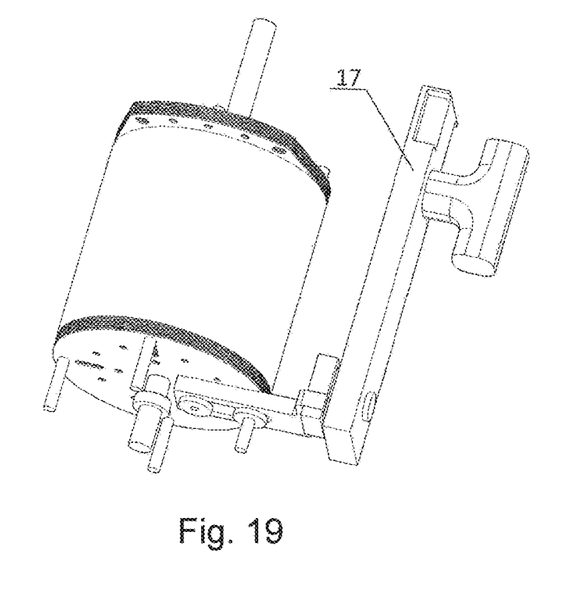
FIG. 19 shows a perspective view of the position of the maneuvering rod (17) in the mechanical locking system according to an embodiment of the present invention.

FIG. 19 shows the position of the maneuvering rod (17) in the mechanical locking system.

Figure 20:
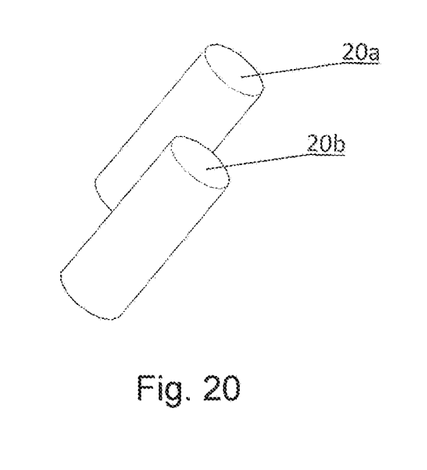
FIG. 20 shows a perspective view of two cylindrical magnets (20a) (20b), which will be mounted on the signal flag (20), according to an embodiment of the present invention.

FIG. 20 shows two cylindrical magnets (20a) (20b), which will be mounted on the signal flag (20).

Figure 21:
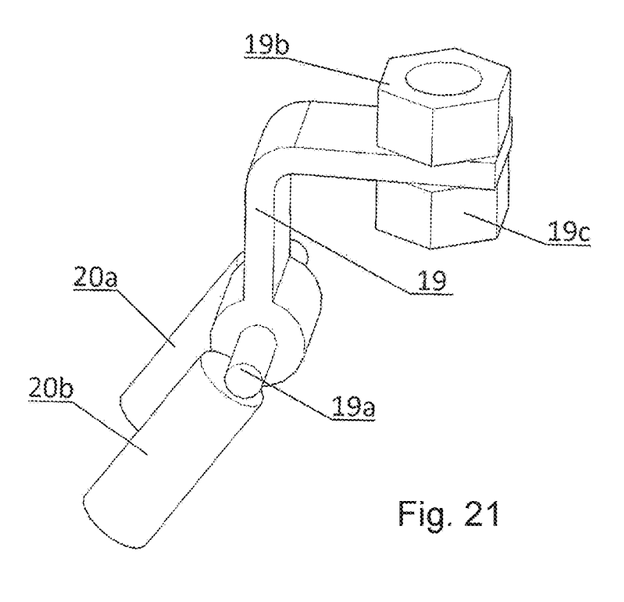
FIG. 21 shows a perspective view of the magnets (20a) (20b), attracting the connecting rod (19), through the ferromagnetic bar (19th), according to an embodiment of the present invention.

FIG. 21 shows the magnets (20a) (20b), attracting the connecting rod (19), through the ferromagnetic bar (19th). The connecting rod (19) will be mounted, using the nuts (19b) (19c), on the axis of the bistable electromagnetic actuator.

Figure 22:
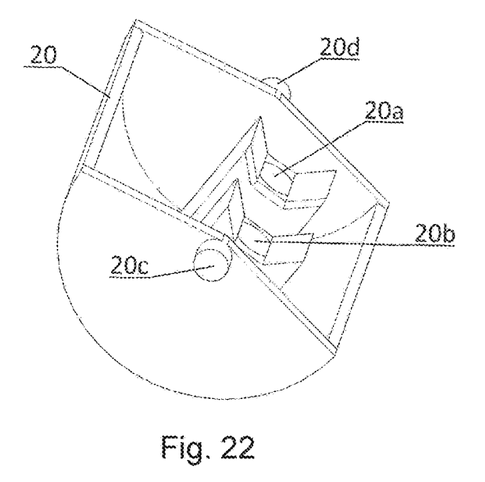
FIG. 22 shows a perspective view of the flag (20), with the magnets (20a) (20b), mounted and the rotation axes (20c) (20d), according to an embodiment of the present invention.

FIG. 22 shows the flag (20), with the magnets (20a) (20b), mounted and the rotation axes (20c) (20d).

Figure 23:
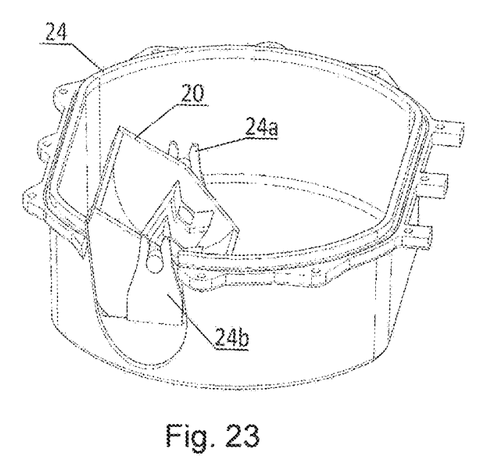
FIG. 23 shows a perspective view of the flag (20) mounted on the transparent bottom cover (24), using the forks (24a) (24b), according to an embodiment of the present invention.

FIG. 23 shows the flag (20) mounted on the transparent bottom cover (24), using the forks (24a) (24b). To improve visualization, the transparent cover (24) has been cut away.

Figure 24:
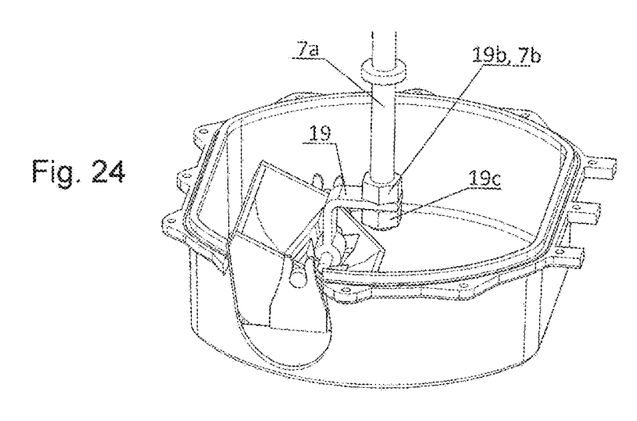
FIG. 24 shows a perspective view of the magnetic connecting rod (19), fixed to the axis (7a) of the bistable electromagnetic actuator (7), using the nuts (19b) (19c), according to an embodiment of the present invention.

FIG. 24 shows the magnetic connecting rod (19), fixed to the axis (7a) of the bistable electromagnetic actuator (7), using the nuts (19b) (19c). When the transparent bottom cover (24) is mounted on the bottle (21), the connecting rod (19) is attracted by the magnets of the flag (20), forming the connection with axis (7a), of the bistable electromagnetic actuator (7). The linear movement of the axis (7a), of the bistable electromagnetic actuator (7) is transferred to the flag (20), causing its circular movement around the axes (20c) (20d). The flag (20), which possesses the colors, green and red, on each half, has the function of indicating, through the transparent bottom cover (24), the state of the recloser, whether closed or open.

Figure 25:
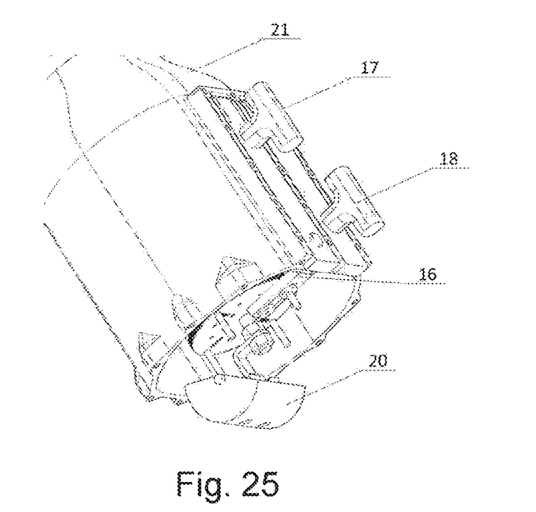
FIG. 25 shows a perspective view of the assembly, in the bottle (21), of the bistable rods (17) (18), the lock (16), and the flag (20), according to an embodiment of the present invention.

FIG. 25 shows the assembly, in the bottle (21), of the bistable rods (17) (18), the lock (16), and the flag (20). The flag (20) is shown in this figure only to facilitate comprehension, but it is mounted on the transparent bottom cover (24).

Figure 26:
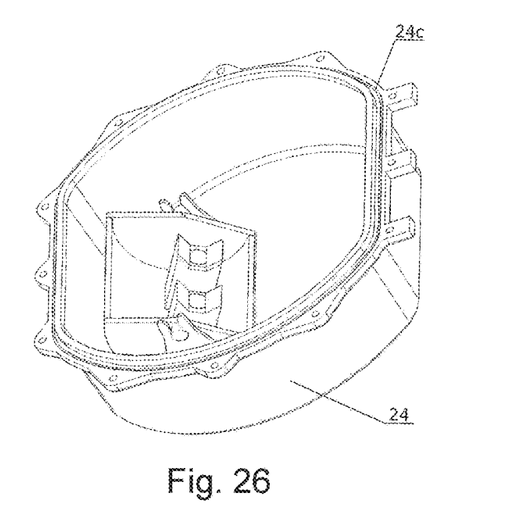
FIG. 26 shows a perspective view of the transparent bottom cover (24), with the flag (20) mounted on the forks (24a) (24b), according to an embodiment of the present invention.
Figure 27:
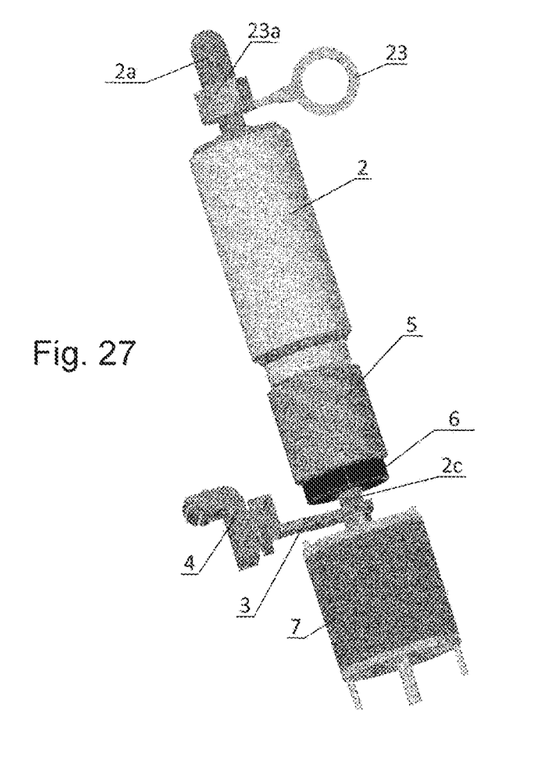
FIGS. 27 through 34 show perspective views of the assembly of the recloser with rendered drawings to facilitate comprehension according to an embodiment of the present invention.
Figure 28:
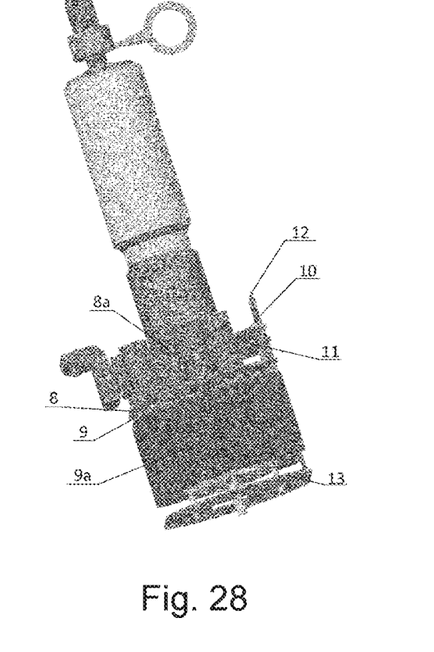
Figure 29:
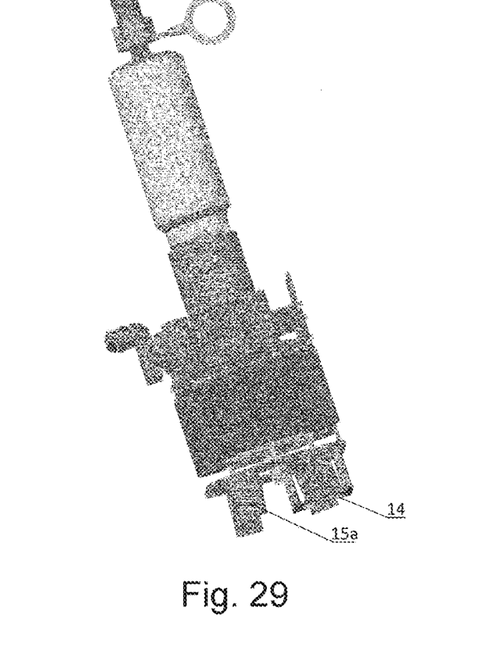
Figure 30:
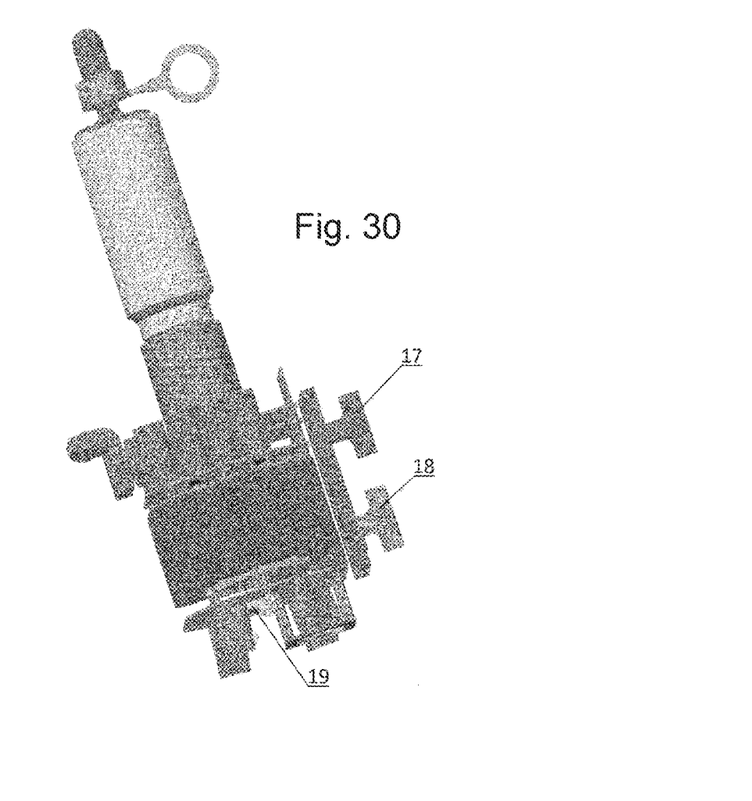
Figure 31:
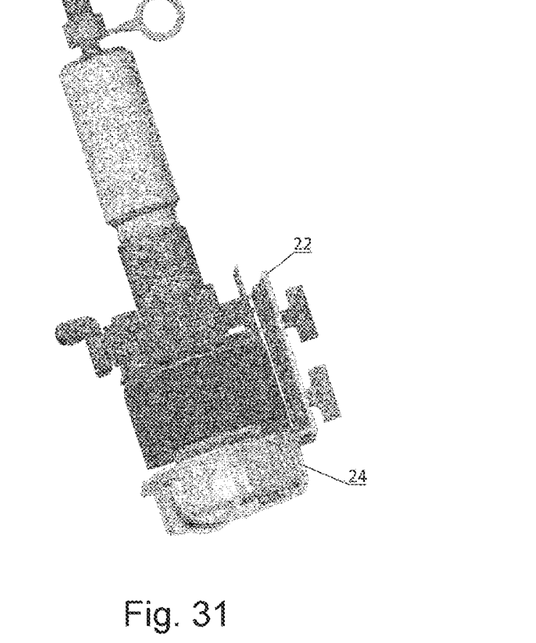
Figure 32:
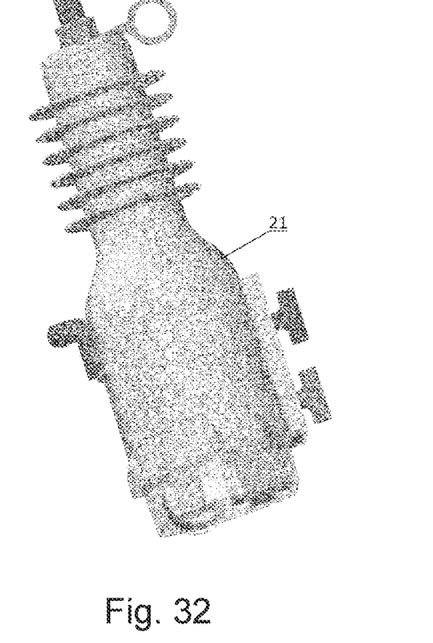
Figure 33:
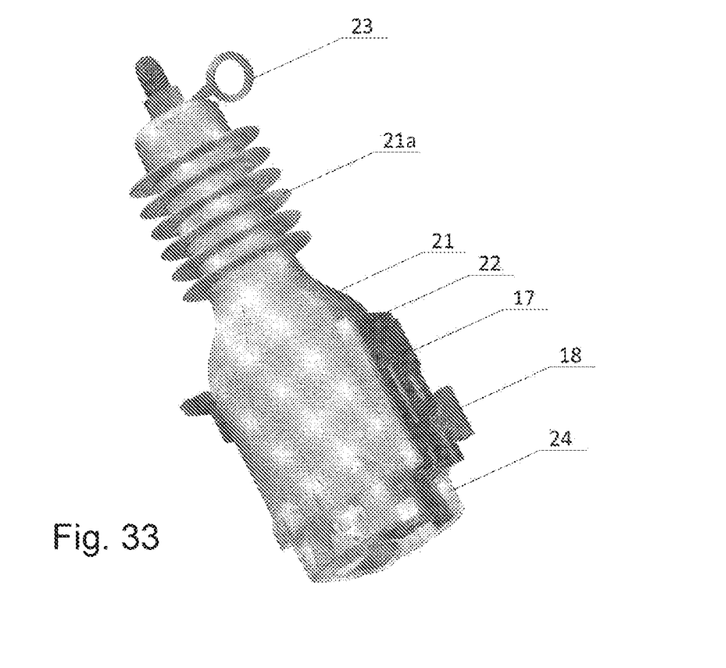
Figure 34:
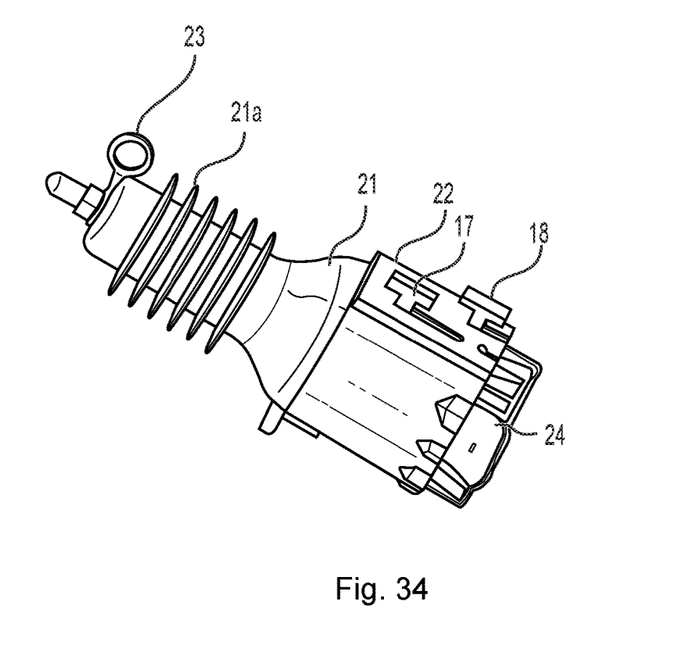

FIG. 26 shows the transparent bottom cover (24), with the flag (20) mounted on the forks (24a) (24b). The transparent bottom cover (24) is fixed to the bottle (21), by means of 12 screws and to ensure a perfect seal of the recloser, it has a channel (24c), which receives an "o-ring" (not drawn).

FIGS. 27 through 34 show the assembly of the recloser with rendered drawings to facilitate comprehension.

Figure 35:
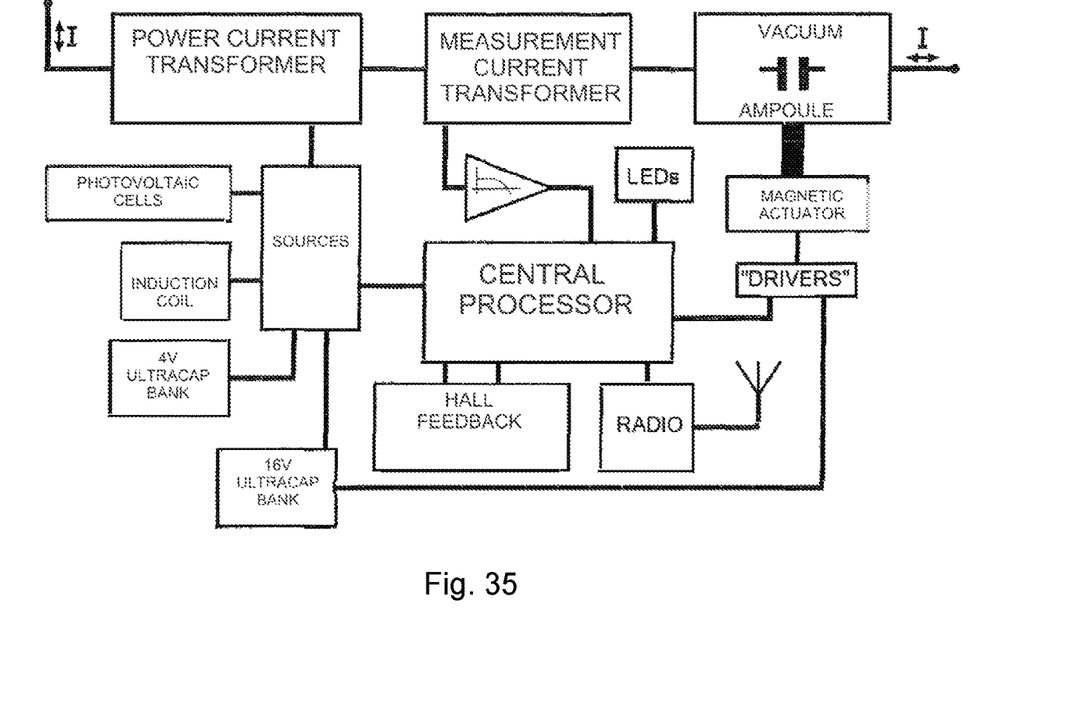
FIG. 35 shows a block diagram which provides a better view of the recloser according to an embodiment of the present invention.

FIG. 35 shows a block diagram which provides a better view of the recloser: when the vacuum ampoule is closed, the current to be protected circulates between the terminals (I); this current passes through the current, power and measurement transformers; a set of power sources receives power; firstly, before the installation of the recloser, from an induction coil; after the installation of the recloser, the set of sources receives power from the power current transformer and also from the photovoltaic cells; the set of sources controls the charge of a 4V ultracapacitor bank, responsible for powering all the electronics, and a 16V ultracapacitor bank, responsible for powering the bistable electromagnetic actuator; the central processor receives information from the line current, generated by the measuring current transformer and filtered by a low pass filter; the CPU also receives, via the "Hall" effect sensors, the position of two maneuvering rods and the position of the bistable electromagnetic actuator; the CPU also controls a radio, a set of "LEDs" and the drivers of the bistable electromagnetic actuator coils.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

The invention claimed is:

1. A SINGLE-PHASE, EQUIPOTENTIAL, LOW-COST, EASY-TO-INSTALL RECLOSER, characterized by the fact that:
   it uses, for its installation, Matheus-type fuse bases (1), pre-installed in the field;
   it uses, for disconnection, a vacuum ampoule (2), triggered by a bistable electromagnetic actuator (7);
   it is equipotential;
   it is self-powered;
   it stores the energy captured in ultracapacitor banks (8a) (9a), which allows it to operate for long periods of "permanent fault"; and
   it transfers the mechanical movement of the cutting maneuvering rod (17) to the mechanical safety lock (16) of the bistable electromagnetic actuator (7) using magnetic fields generated by movements of the magnets (16a) (16b) (16c), avoiding holes in the bottle (21) for the passage of moving parts, and allowing for its use in places with high levels of moisture and/or dust (IP67).

2. The SINGLE-PHASE, EQUIPOTENTIAL, LOW-COST, EASY-TO-INSTALL RECLOSER, in accordance with claim 1, characterized by the fact that it uses a simple, lightweight, low-cost, closed-field bistable electromagnetic actuator (7).

3. The SINGLE-PHASE, EQUIPOTENTIAL, LOW-COST, EASY-TO-INSTALL RECLOSER, in accordance with claim 1, characterized by the fact that it uses, for energy storage, ultracapacitors (8a) (9a), with a useful life of more than 20 years.

4. The SINGLE-PHASE, EQUIPOTENTIAL, LOW-COST, EASY-TO-INSTALL RECLOSER, in accordance with claim 1, characterized by the fact that it uses, for current measurement, an air-core transformer (6), (Rogowski coil).

5. The SINGLE-PHASE, EQUIPOTENTIAL, LOW-COST, EASY-TO-INSTALL RECLOSER, in accordance with claim 1, characterized by the fact that, in addition to ultracapacitors, it uses only ceramic capacitators, achieving a very high average time between faults.

6. The SINGLE-PHASE, EQUIPOTENTIAL, LOW-COST, EASY-TO-INSTALL RECLOSER, in accordance with claim 1, characterized by the fact that it uses magnets to achieve the bistable effect of the maneuvering rods (17) (18).

7. The SINGLE-PHASE, EQUIPOTENTIAL, LOW-COST, EASY-TO-INSTALL RECLOSER, in accordance with claim 1, characterized by the fact that it transfers the linear movement of the axis (7a) of the bistable electromagnetic actuator (7) to the circular motion flag (20) through a magnetic connecting rod (19).

8. The SINGLE-PHASE, EQUIPOTENTIAL, LOW-COST, EASY-TO-INSTALL RECLOSER, in accordance with claim 1, characterized by the fact that it uses, for the first charge of the ultracapacitor banks, (8a) (9a) an induction coil (14).

9. The SINGLE-PHASE, EQUIPOTENTIAL, LOW-COST, EASY-TO-INSTALL RECLOSER, in accordance with claim 1, characterized by the fact that it can be used in any Matheus fuses base.

10. A single-phase, equipotential recloser, comprising:
    a vacuum ampule, comprising:
      a fixed output terminal at a first end; and
      a movable output terminal at a second end, opposite to the first end;
    a bistable electromagnetic actuator configured to trigger the vacuum ampule;
    an ultracapacitor bank configured to store captured energy,
    wherein the fixed output terminal is configured to connect to a fuse base at a first connection terminal of the fuse base and the movable output terminal is configured to connect to the fuse base at a second connection terminal of the fuse base.

11. The single-phase, equipotential recloser according to claim 10, further comprising an air-core transformer for current measurement.

12. The single-phase, equipotential recloser according to claim 10, wherein the fuse base comprises a Matheus-type fuse base.

13. The single-phase, equipotential recloser according to claim 10, wherein the movable output terminal is connected to the second connection terminal of the fuse base by a flexible cord.

14. The single-phase, equipotential recloser according to claim 13, wherein the actuator is connected to the vacuum ampule at a position below the flexible cord.

15. The single-phase, equipotential recloser according to claim 13, wherein the ultracapacitor bank comprises:
    a first circuit board and a second circuit board each fixed on the actuator;
    a plurality of ultracapacitors housed within each of the first circuit board and the second circuit board.

16. The single-phase, equipotential recloser according to claim 10, wherein the actuator is a bistable electromagnetic actuator comprising a mechanical safety lock.

17. The single-phase, equipotential recloser according to claim 16 further comprising
    a maneuvering rod; and
    a plurality of magnets configured to generate magnetic fields by movement of the plurality of magnets,
    wherein mechanical movement of the maneuvering rod is transferred to the mechanical safety lock using the magnetic fields.

18. An assembly, comprising:
    a fuse base, comprising:
      a first connection terminal; and
      a second connection terminal; and
    a single-phase, equipotential recloser, comprising:
      a vacuum ampule, comprising:
        a fixed output terminal at a first end; and
        a movable output terminal at a second end, opposite to the first end;
      a bistable electromagnetic actuator configured to trigger the vacuum ampule;
      an ultracapacitor bank configured to store captured energy, wherein the fixed output terminal is configured to connect to the fuse base at the first connection terminal of the fuse base and the movable output terminal is configured to connect to the fuse base at the second connection terminal of the fuse base.

* * * * *